(12) United States Patent
Gerstenhaber et al.

(10) Patent No.: US 7,656,009 B2
(45) Date of Patent: Feb. 2, 2010

(54) ROBUST ESD CELL

(75) Inventors: Moshe Gerstenhaber, Newton, MA (US); Padraig Cooney, Medford, MA (US)

(73) Assignee: Analog Devices, Inc., Norwood, MA (US)

( * ) Notice: Subject to any disclaimer, the term of this patent is extended or adjusted under 35 U.S.C. 154(b) by 269 days.

(21) Appl. No.: 11/697,814

(22) Filed: Apr. 9, 2007

(65) Prior Publication Data

US 2008/0246115 A1  Oct. 9, 2008

(51) Int. Cl.
*H01L 23/60* (2006.01)
*H01L 29/8605* (2006.01)

(52) U.S. Cl. .................. 257/541; 257/572; 257/358; 257/360; 257/361; 257/362; 257/363; 257/E27.019

(58) Field of Classification Search ................ 257/358, 257/360, 361, 362, 363, E27.019
See application file for complete search history.

(56) References Cited

U.S. PATENT DOCUMENTS

| 4,659,979 | A | * | 4/1987 | Burnham et al. | ............ | 323/312 |
| 5,212,618 | A | * | 5/1993 | O'Neill et al. | ................ | 361/56 |
| 6,777,784 | B1 | | 8/2004 | Vashchenko et al. | | |

FOREIGN PATENT DOCUMENTS

| DE | 2206353 | 10/1972 |
| JP | 58199563 | 11/1983 |
| JP | 2005235844 | 9/2005 |

* cited by examiner

*Primary Examiner*—Ngan Ngo
*Assistant Examiner*—Benjamin Tzu-Hung Liu
(74) *Attorney, Agent, or Firm*—Kenyon & Kenyon LLP

(57) ABSTRACT

An electric discharge device includes a bipolar transistor configuration comprising a base, an emitter, and a collector. At least one pinched resistor is formed in a region comprising both the base and emitter so as to produce a pinched resistive area that develops a voltage once the bipolar transistor experiences junction breakdown.

20 Claims, 5 Drawing Sheets

ROBUST ESD CELL

BACKGROUND OF THE INVENTION

The invention relates to the field of ESD cells, in particular to an ESD cell having a pinched resistive area.

FIG. 1 is a cross-sectional view of a conventional bipolar transistor-based ESD protection structure 10. Conventional bipolar transistor-based ESD protection structure 10 includes a P-type substrate 12, an N-type collector region 14, a P-type base region 16 (e.g., a P-type Si—Ge base region) and an N-type polysilicon emitter 18. The conventional bipolar transistor-based ESD protection structure 10 also includes electrical isolation regions 20 and 22. A metal base contact 24 makes contact with the P-type base region 16 via polysilicon line 26. A metal emitter contact 28 is in contact with the N-type polysilicon emitter 18, while a metal collector contact 30 is in contact with the N-type collector region 14. The metal base contact 24, the metal emitter contact 28 and the metal collector contact 30 each extends through dielectric layer 32.

Electrical schematics illustrating this conventional bipolar transistor-based ESD protection structure 10 arranged in a grounded base bipolar transistor-based ESD protection device and a Zener Triggered bipolar transistor-based ESD protection device are provided in FIGS. 2A and 2B, respectively.

SUMMARY OF THE INVENTION

According to one aspect of the invention, there is provided an electric discharge device (ESD). The ESD includes a bipolar transistor configuration comprising a base, an emitter, and a collector. At least one pinched resistor is formed in a region comprising both the base and emitter so as to produce a pinched resistive area that develops a voltage once the bipolar transistor experiences junction breakdown.

According to another aspect of the invention, there is provided a method of forming an electric discharge device. The method includes providing a bipolar transistor configuration comprising a base, an emitter, and a collector. Also, the method includes forming at least one pinched resistor in a region comprising both the base and emitter so as to produce a pinched resistive area that develops a voltage once the bipolar transistor experiences junction breakdown.

DETAILED DESCRIPTION OF THE INVENTION

The invention involves the use of a pinched resistive area that develops a voltage once junction breakdown occurs.

Figure 1:
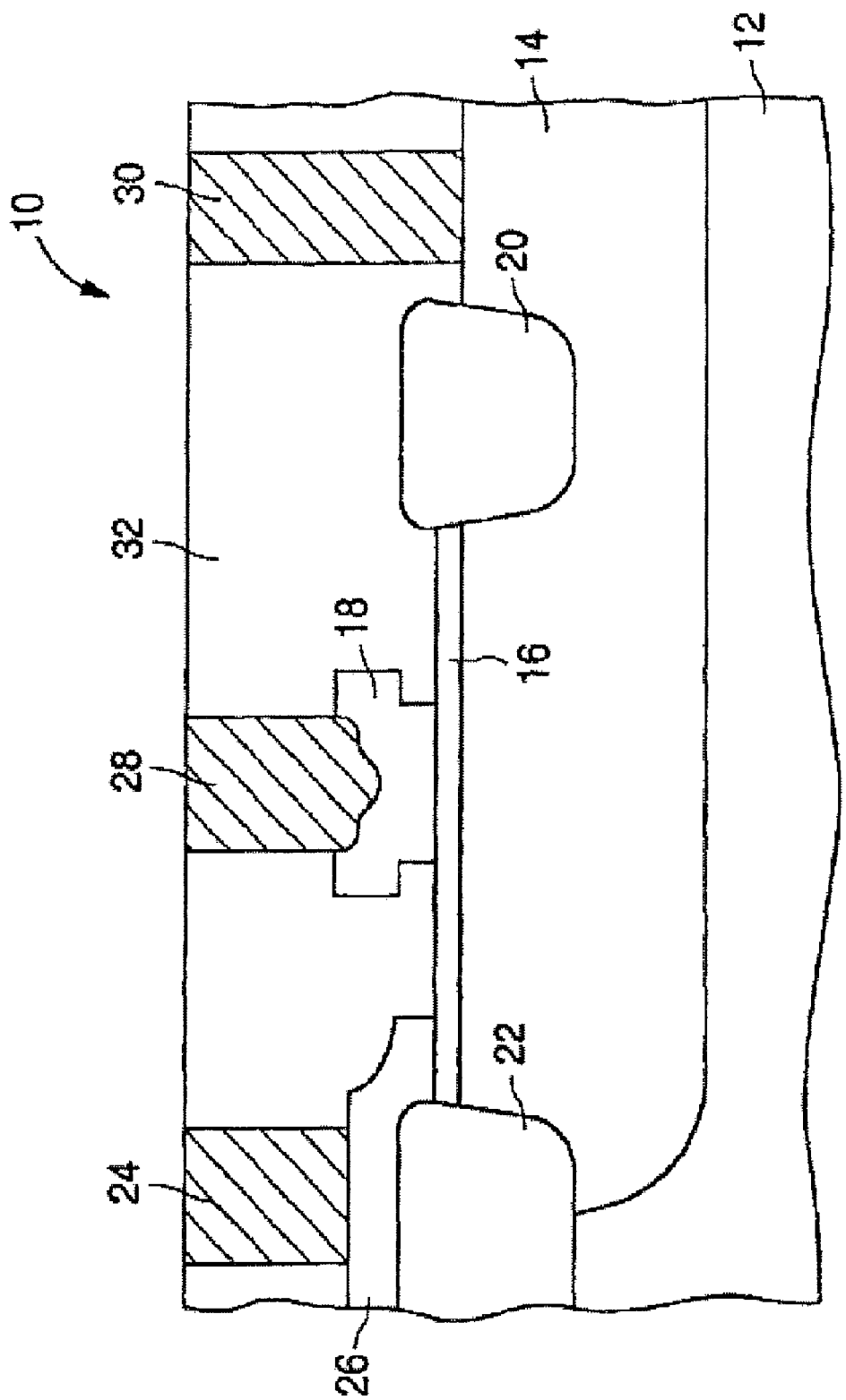
FIG. 1 is a schematic diagram of a conventional ESD device.
Figure 2B:
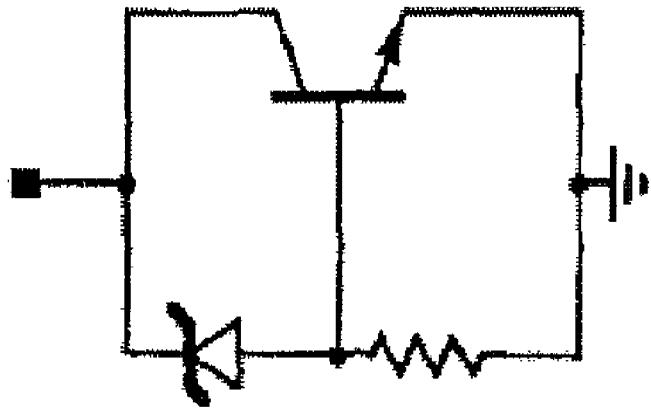
FIGS. 2A-2B are circuit diagrams representing conventional ESD devices.
Figure 2A:
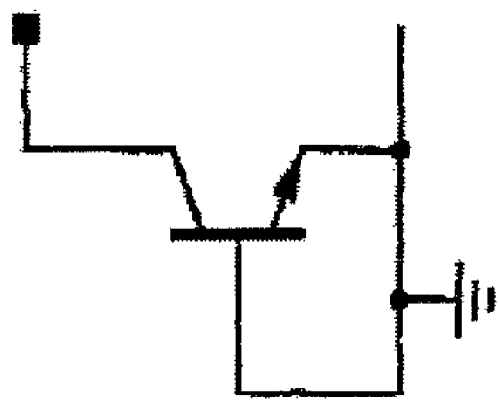
Figure 3:
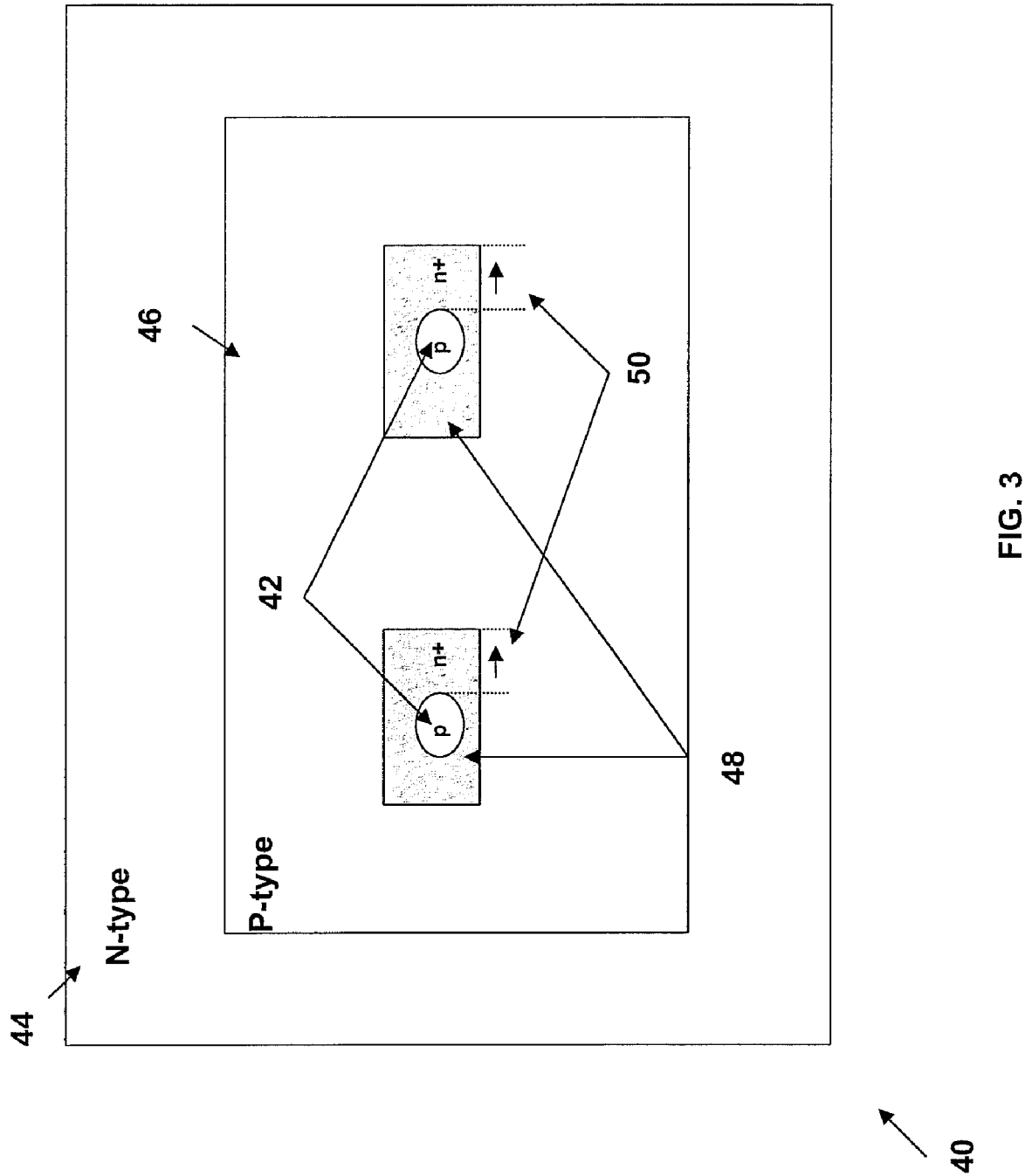
FIG. 3 is a schematic diagram illustrating a top view of the inventive ESD device.

FIG. 3 shows the inventive ESD device 40 having a pinched resistive area 50. The ESD 40 includes a N-type collector region 44, a P-type base region 46, and N+-type emitter regions 48. Note the ESD device 40 resembles that of a bipolar transistor based ESD device. In other embodiments, the ESD device 40 can include a P-type material collector, a N-type base, and P+-type emitter.

The invention includes a pinched resistive region 50 formed under the emitter regions 48 and the exposed P-type materials comprising the hole 42 and base region 46. A hole 42 is formed in an area comprising the emitter regions 48 leaving an exposed region of the base region 46. The materials inside the hole 42 is connected to the emitter region 48 using an interconnect, such as Al or the like. The collector 44 is connected to a respective node to be protected and the hole 42 and the emitter regions 48 can be connected to ground. Another way also is the hole 42 and the emitter regions 48 can be connected to a node to be protected and the collector 44 can be connected to a positive supply.

In this embodiment, the hole 42 is circular shaped however in other embodiments the shape can vary depending on how much resistance is needed and materials used to form the hole 42, thus one can control the resistive value of the ESD device 40.

The pinched resistive region 50 develops a voltage once junction breakdown occurs. If the voltage that is generated across the pinched resistive region 50 is of sufficient magnitude, it will forward bias the pn junction between the base region 46 and emitter regions 48, which creates a normal bipolar transistor action so as to allow current to flow only thru the pinched resistive region. The excess current is pumped into the collector region 44. Note the ESD device 40 resembles a bipolar transistor. The result of such a configuration is reduced surface power density and faster turn-on of the ESD device 40 which yields higher reliability and higher ESD rating.

Figure 4:
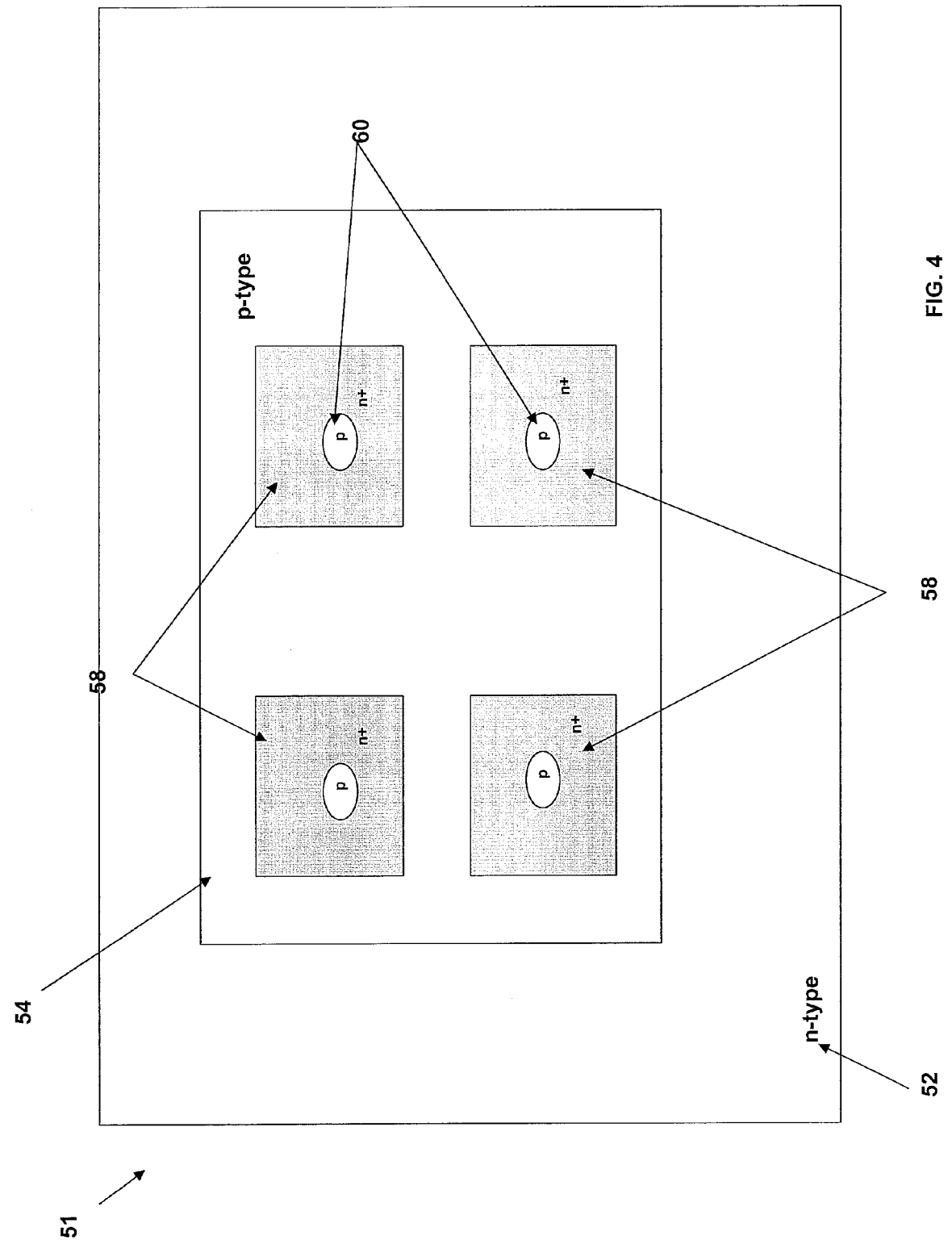
FIG. 4 is a schematic diagram illustrating a top view of another of the inventive ESD device.

FIG. 4 shows the top view of the inventive ESD device 51. The ESD device 51 includes a collector region 52 which is n-type. The collector region includes a base region 54 that includes emitter regions 58. Each of the emitter regions 58 includes a hole 60 which produces pinched resistive regions similar to pinched resistive region 50, as shown in FIG. 3. In other embodiments, the number of emitter regions 58 can vary depending on the size of base region 54. As more pinched resistive regions are formed on a base-emitter region the more uniform the injection of the protection device become. In this embodiment, the hole 60 is circular shaped however in other embodiments the shape can vary depending on how much resistance is needed and materials used to form the base region 54, thus one can control the resistive value of the ESD device 51.

Figure 5:
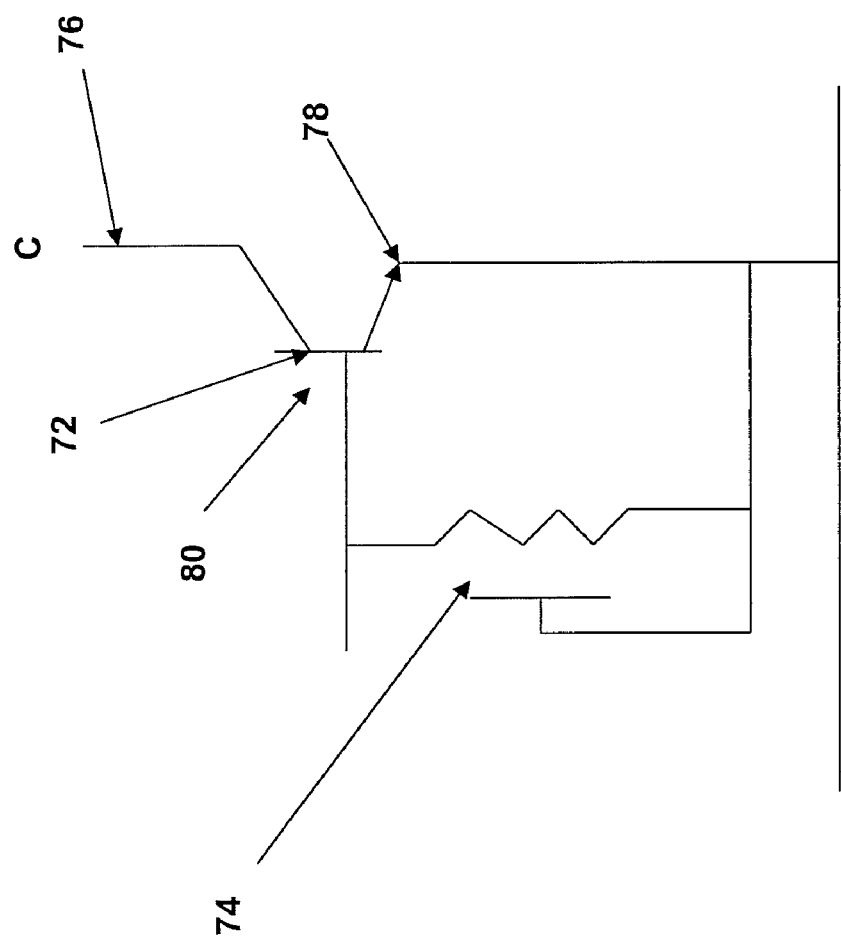
FIG. 5 is a circuit diagram representing the inventive ESD device.

FIG. 5 shows a circuit representation of the inventive ESD device 70. The ESD device 70 includes a bipolar transistor 72 and a pinched resistor 74. The bipolar transistor includes a collector 76, an emitter 78, and a base 80. The base 80 of the transistor 72 is coupled to the pinched resistor 74. The pinched resistor 74 is also coupled to the emitter 78 of the bipolar transistor 72. Note the emitter 78 can be coupled to ground and the collector 76 can be coupled to a voltage source.

The pinched resistor 74 develops a voltage once junction breakdown occurs. If the voltage that is generated across the pinched resistor 74 is of sufficient magnitude, it will forward bias the pn junction between the base 80 and emitter 78, which creates a normal bipolar transistor action. The excess current is pumped into the collector 78.

Although the present invention has been shown and described with respect to several preferred embodiments thereof, various changes, omissions and additions to the form and detail thereof, may be made therein, without departing from the spirit and scope of the invention.

What is claimed is:

1. An electric discharge device (ESD) comprising:
   a bipolar transistor configuration comprising a base, an emitter, and a collector; and
   at least one pinched resistor that is formed using at least one circular shape opening on said emitter in a region comprising both said base and said emitter, said at least one pinched resistor to produce a pinched resistive area that develops a voltage once said bipolar transistor experiences junction breakdown allowing current to flow only through said pinched resistive area.

2. The ESD of claim 1, wherein said pinched resistor is formed using a plurality of circular shape openings on said emitter.

3. The ESD of claim 2, wherein said circular shape openings comprise the same materials said base.

4. The ESD of claim 1, wherein said voltage forwards a pn junction formed by said base and said emitter.

5. The ESD of claim 1, wherein said collector comprising N-type materials.

6. The ESD of claim 5, wherein said base comprises P-type materials.

7. The ESD of claim 6, wherein said emitter comprises N+-type materials.

8. The ESD of claim 1, wherein said collector comprises P-type materials.

9. The ESD of claim 8, wherein said base comprises N-type materials.

10. The ESD of claim 9, wherein said emitter comprises P+-type materials.

11. A method of forming an electric discharge device (ESD) comprising:
    providing a bipolar transistor configuration comprising a base, an emitter, and a collector and
    forming at least one pinched resistor using at least one circular shape opening on said emitter in a region comprising both said base and said emitter, said at least one pinched resistor to produce a pinched resistive area that develops a voltage once said bipolar transistor experiences junction breakdown allowing current to flow only through said pinched resistive area.

12. The method of claim 11, wherein said pinched resistor is formed using a plurality of circular shape openings on said emitter.

13. The method of claim 12, wherein said circular shape openings comprise the same materials said base.

14. The method of claim 11, wherein said voltage forwards a pn junction formed by said base and said emitter.

15. The method of claim 11, wherein said collector comprises N-type materials.

16. The method of claim 15, wherein said base comprises P-type materials.

17. The method of claim 16, wherein said emitter comprise N+-type materials.

18. The method of claim 11, wherein said collector comprises P-type materials.

19. The method of claim 18, wherein said base comprises N-type materials.

20. The method of claim 19, wherein said emitter comprises P+-type materials.

* * * * *